(12) United States Patent
Dave et al.

(10) Patent No.: US 6,848,036 B1
(45) Date of Patent: Jan. 25, 2005

(54) METHOD AND APPARATUS FOR FASTER BLOCK SIZE CALCULATIONS FOR INTERLEAVING

(75) Inventors: Sanjay Shashi Dave, Mountain View, CA (US); Warangkana Tepmongkol, Santa Clara, CA (US); Alexander Hubris, San Jose, CA (US)

(73) Assignee: Terayon Communication Systems, Inc., Santa Clara, CA (US)

( * ) Notice: Subject to any disclaimer, the term of this patent is extended or adjusted under 35 U.S.C. 154(b) by 757 days.

(21) Appl. No.: 09/648,278

(22) Filed: Aug. 23, 2000

(51) Int. Cl.[7] ............................................. G06F 12/00
(52) U.S. Cl. ........................................................ 711/157
(58) Field of Search ................................. 711/157, 127; 365/230.03, 230.04

(56) References Cited

U.S. PATENT DOCUMENTS 6,065,092 A * 5/2000 Roy .............................. 711/5

* cited by examiner

*Primary Examiner*—Matthew D. Anderson
(74) *Attorney, Agent, or Firm*—Ronald C. Fish; Ronald Craig Fish, A Law Corp.

(57) ABSTRACT

An interleaver for any modem or transmitter which transmits digital data. The interleaver eliminates the iterative divide step of a first prior art method to calculate the final depth of each block and the divide followed by a multiply step of a second prior art method. This is done by calculating the minimum depth, i.e., number of rows, for each 2-D block of data using a divide step and retaining the remainder. The remainder is used to determine how many blocks get an extra row when the burst length and width of each row precludes all blocks from having the same number of rows.

3 Claims, 2 Drawing Sheets

SB: START OF BURST PULSE

AS: PULSE EVERY NEW DATA BYTE

EB: END OF BURST PULSE

DATA: 8 BITS

METHOD AND APPARATUS FOR FASTER BLOCK SIZE CALCULATIONS FOR INTERLEAVING

BACKGROUND OF THE INVENTION

The invention pertains to the field of interleaving of bytes or symbols in streams of data to be transmitted as analog signals over noisy channels such as hybrid fiber coax of CATV systems, telephone lines, etc. More particularly, the invention pertains to a method for calculating block depth in interleaving circuitry more rapidly and with less expensive circuitry by eliminating an iterative divide step required by a first prior art method and by eliminating a multiplication step in a second prior art method.

Interleaving is a well known process of taking the contiguous bits or contiguous groups of bits called symbols from a byte and spreading them out in time for transmission. By spreading the bits or symbols of a byte over time over a noisy channel, and re-assembling the bits or symbols at the receiver, greater noise immunity can be achieved. Specifically, interleaving provides immunity to noise bursts which could otherwise wipe out an entire byte of data or several contiguous bytes.

Recently, a new type of modem called a cable modem has appeared on the market. As opposed to telephone modems which convert digital data to analog sound signals for transmission over telephone lines, cable modems convert digital data to radio frequency signals for transmission over hybrid fiber coaxial cable networks of cable TV systems. In the cable modem market, a new standard called DOCSIS has emerged which specifies certain aspects of cable modem designs for DOCSIS compliant cable modems.

The Institute of Electrical and Electronic Engineers (IEEE) has a working group which has recently proposed a high capacity physical layer specification for DOCSIS compliant cable modems. One of the upstream modes for such modems is a TDMA mode. This is a time division multiple access mode where bits from different channels or sources are transmitted upstream to the cable system head end during different timeslots. The bytes/symbols transmitted in each timeslot must be interleaved and this requires an interleaver circuit. Under the proposed methodology, bytes/symbols are transmitted to the interleaver in bursts from a Reed-Solomon encoder. These bursts are comprised of a series of codewords each of which has K bytes of payload and T error correction and detection bytes. Each bursts also has a burst profile transmitted therewith that includes data needed by the interleaver to calculate "block depth".

Each block is a two dimensional array of multiple rows and columns of bytes or symbols. Interleaving is accomplished by writing bytes or symbols of the codewords into the blocks horizontally along the rows, but reading the bytes or symbols out of the blocks for transmission by column. This has the effect of interleaving the bytes or symbols by spreading them out over time. The codewords each have a width K+T which defines the width or number of bytes in each row of each block.

Sometimes the burst profile defines both the width and the depth of each block so there is no calculation for the interleaver to do. However, it also sometimes happens that the burst profile only specifies the width of each block and does not specify the depth, i.e., the number of rows in each block. In this case the interleaver circuit must calculate the number of rows in each block itself from the data it is given in the burst profile. The burst profile in this case will give only the block width in bytes or symbols and the maximum block size in bytes or symbols, the total number of bytes or symbols permitted in each block. This information, plus the length of the burst, i.e., the total number of bytes or symbols in the burst which is to be converted into blocks (each burst is different in size) is used by the interleaver to calculate the depth or number of rows in each block.

The goal is to try to get the number of rows in each block as close as possible to equal where the number of bytes or symbols in the burst is such that not all blocks can have the same number of rows. Making the blocks all approximately equal in depth gives all blocks approximately the same noise immunity.

The 802.14 Committee has proposed two prior art methods for calculating block depth in a DOCSIS compliant interleaver. The first method in the prior art differs from the second method in the prior art in that it involves an iterative divide step whereas the second method only has a one time divide step followed by a one time multiply step. The first method also differs from the second method in terms of where the short block occurs if not all blocks made from a burst have the same depth.

Prior art method 1 involves the following sequence of calculations. First, the total number of interleaver rows is calculated:

$$I_{TOT}^{O} = CEIL(N_P/N_T) \quad (1)$$

where $I_{TOT}^{O}$=the total number of rows that can be made from a burst, $N_P$=the total burst length in number of bytes or symbols; and $N_T$=the width or number of bytes or symbols in each row which also equals K+2T which is the length of the codeword output by the Reed-Solomon encoder; and where CEIL is a mathematical operation of rounding up to the next integer if the result of the division is not a whole number.

Next, the maximum number of rows per block is calculated as follows:

$$I_{T,MAX} = FLOOR(B_T/N_T) \quad (2)$$

where $I_{T,MAX}$=the maximum number of rows in each block;

$B_T$=the maximum number of bytes or symbols in each block given by the burst profile;

$N_T$=size of each row; and

FLOOR=is the mathematical operation of taking the next integer down if the result of the division is not a whole number.

Next, the method 1 calculation calculates the number of blocks that can be formed from the burst:

$$N_S^{O} = CEIL(I_{TOT}^{O}/I_{T,MAX}) \quad (3)$$

where $I_{TOT}^{O}$=the total number of rows that can be made from a burst; and $I_{T,MAX}$=the maximum number of rows per block.

Finally, an iterative calculation is made to calculate the depth $I_T^{(M)}$ for each block where M is the block number in the series of blocks being formed:

$$I_T^{(M)} = CEIL(I_{TOT}^{(M-1)}/N_S^{(M-1)}) \text{ for } M=1,2,\ldots,N_S^{O} \quad (4)$$

where $I_{TOT}^{(M-1)}$=the total number of rows left to be put in a block which have not been consumed in previous blocks; and
$N_S^{(M-1)}$=the number of blocks left to create Step 5 is the iterative decrementing of the number of blocks left to create, calculated as follows:

$$N_S^{(M)} = N_S^{(M-1)} - 1 \quad (5)$$

Finally, step 6 is the iterative calculation of the number of rows left to be assigned to blocks after creation of the block whose depth was just calculated, which is calculated as:

$$I_{TOT}^{(M)} = I_{TOT}^{(M-1)} - I_T^{(M)} \quad (6)$$

The problem with this method 1 calculation is that it is slow because of the iterative divide required by equation (4). In other words, equation (4) must be calculated once for each block to be made from a burst. Divides are slow, and this slows the entire operation down.

Method 2 of the prior art does not involve an iterative divide, but is requires a divide followed by a multiply as both a divider and a multiplier are required. The calculation of method 2 is as follows. First, the total number of interleaver rows is calculated:

$$I_{TOT}^O = CEIL(N_F/N_R) \quad (7)$$

where
$I_{TOT}^O$ is the total interleaver rows that can be made from a burst;
$N_F$=the total number of bytes or symbols in a burst=$N_P$ in method 1; and
$N_R$=the width in bytes or symbols of each row in each block.

Next in method 2, the maximum number of rows per block is calculated as follows:

$$I_{R,MAX} = FLOOR(B_r/N_r) \quad (8)$$

where
$I_{R,MAX}$=the maximum number of rows per block;
$B_r$=the maximum number of bytes or symbols in each block (from the burst profile);
$N_r$=the number of bytes or symbols in each row.

Next, the number of blocks is calculated as:

$$N_S^O = CEIL(I_{TOT}^O/I_{R,MAX}) \quad (9)$$

where
$N_S^O$ is the number of blocks that will be made from the burst;
$I_{TOT}^O$ is the total number of rows that can be made from the burst; and
$I_{R,MAX}$ is the maximum number of rows per block.

Next in method 2, the depth or number of rows that will be in the first block is calculated by a one time divide as follows:

$$I_R^1 = FLOOR(I_{TOT}^O/N_S^O) \quad (10)$$

where
$I_R^1$ is the number of rows in the first block;
$I_{TOT}^O$ is the total number of interleaver rows that can be made from the burst; and
$N_S^O$ is the number of blocks to be made from the burst.

Next in method 2, a one time multiply is performed to calculate the number of blocks with depth $I_R^1$ will be made as follows:

$$M = N_S^O * (I_R^1 + 1) - I_{TOT}^O \quad (11)$$

where

M is the number of blocks of depth $I_R^1$ that will be made; and
$I_R^1$=the depth of the first block; and
$I_{TOT}^O$ is the total number of interleaver rows that can be made from the burst; and
$N_S^O$ is the number of blocks to be made from the burst.

Finally, an iterative calculation is made from each block as follows:

$$I_R^{(i)} = I_R^1, i=1, \ldots, M$$

$$I_R^1, i=M+1, \ldots, N_O^S$$

The problem with the method 2 calculation is that, although it does not require an iterative divide like method 1, it does require both a one time divide and a one time multiply. Therefore, both a divider and a multiplier are required.

Therefore, a need has arisen for a faster, more economical way of calculating depth of blocks in interleavers in general, and interleavers for DOCSIS compatible cable modems in particular.

SUMMARY OF THE INVENTION

The genus of the invention include all species of interleavers which create two-dimensional blocks of data to be interleaved and which calculate the depth of each block to be made from a burst by using the remainder of a specific divide step to determine how many blocks get one extra row. Specifically, an interleaver within the invented genus will receive burst length, maximum block size and row width data as part of a burst profile which defines a burst and the blocks to be made from it. This burst profile data and intermediate results calculated therefrom are used to calculate: the total number of rows of width $N_T$ that can be made from a burst of length $N_F$; the maximum number of rows of width $N_T$ that can be made from a block of the maximum size $B_T$ specified in the burst profile; the total number $N_S$ of blocks that can be made from a burst of length $N_F$; and the minimum depth $I_{T,BASE}$ or number of rows that each of the $N_S$ blocks will have. The last calculation is the key to the advantage of the genus of the invention over the prior art, because the remainder of this divide step is retained instead of discarded as in the prior art. In interleavers according to the teachings of the invention, the remainder is used to determine how many blocks will be formed with the minimum depth $I_{T,BASE}$ and how many blocks will be formed with one extra row. Specifically, if the remainder is X, then X of the $N_S$ blocks will be formed with $I_{T,BASE}+1$ rows, and $N_S-X$ blocks will be formed with only number of rows equal to $I_{T,BASE}$.

DETAILED DESCRIPTION OF THE PREFERRED AND ALTERNATIVE EMBODIMENTS

Figure 1:
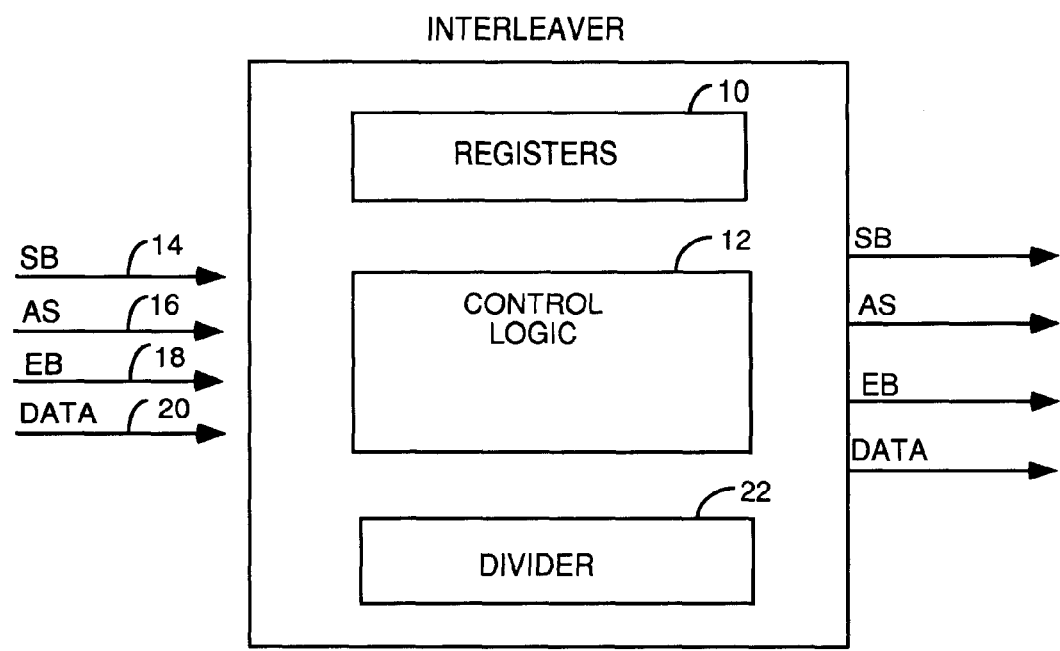
FIG. 1 is a block diagram of an example of an interleaver according to the teachings of the invention.

Referring to FIG. 1, there is shown an example of an interleaver according to the teachings of the invention. The interleaver of FIG. 1 is comprised of a plurality of registers 10 to store data from the burst profile, intermediate results and final calculation results. A control logic block 12 receives control signals and data on lines 14, 16, 18 and 20 and is coupled to said registers in register block 10 so as to read data from these registers and write data therein. The control logic 12 is also coupled to a divider circuit 22 to supply operands to it and to store results from division operations in various registers of register block 10. The control logic also controls the divider 22 through control signals (not shown) to control the divide operations thereof. In some embodiments, the control logic 12 is a microprocessor 12 programmed to receive data from the signal and data inputs 14–20 and manage the registers 10 and divider 22 to implement the algorithm to be described below. In such embodiments the registers and divider are physically separate circuits from said microprocessor. In other embodiments, either the registers or the divider or both can be part of the microprocessor.

The "Sb" input signal on line 14 is a start of burst pulse which activates or occurs at the start of a burst to be interleaved. The "as" signal on line 16 is a pulse which occurs each time a new data byte in the burst arrives on data line 20. The "eb" signal on line 18 is a pulse which occurs at the end of each burst. The data of the burst which arrives on line 20 is a concatenation of 8-bit bytes.

The registers 10 store burst profile information to be used as operands including: $N_P$ which is the packet size or burst length in bits or symbols; $N_T$ which is the interleaver width, i.e., the width in bits or symbols of one row of a block; and, $B_T$ which is the interleaver block size, i.e., the maximum number of bits or symbols in a block.

When control logic 12 senses receipt of a start of burst pulse Sb on line 14, it starts the calculation. Control logic 12 will be defined in terms of what it does rather than what it is since what it is is not critical to the invention. Any programmed microprocessor, custom integrated circuit, field programmable gate array, gate array or FPLA that can control registers 10 and divider 22 to implement the following algorithm will suffice to practice the invention.

The algorithm that control logic 12 implements is as follows. The first step is to calculate the total number of rows of width NT which can be made from the incoming burst, which is done as follows:

$$I_{TOT} = CEIL(N_P/N_T) \quad (13)$$

where $T_{TOT}$=the total integer number of rows of width $N_T$ which can be made from a burst of length $N_P$ bits or symbols. After the division of $N_P$ by $N_T$, if there is a remainder, then $I_{TOT}$ will be set equal to the quotient plus 1 by the operation of the CEIL mathematical function implemented by control logic 12. If there is no remainder then $I_{TOT}$ is set equal to the quotient. The value $I_{TOT}$ is then stared in registers 10.

Next, the maximum number of rows of width $N_T$ bits or symbols which can be made from a block of maximum size $B_T$ bits or symbols is calculated as follows:

$$I_{T,MAX} = FLOOR(B_T/N_T) \quad (14)$$

where $I_{T,MAX}$ is the maximum number of rows,
$B_T$ is the maximum number of bits or symbols in each block, and
$N_T$ is the width in bits or symbols of each row. The control logic 12 stores the calculated value of $I_{T,MAX}$ in registers 10. $I_{T,MAX}$ is set equal to the quotient and there are no remainder considerations.

Next, the number of blocks that can be made from a burst of length $N_P$ is calculated as follows:

$$N_S = CEIL(I_{TOT}/I_{T,MAX}) \quad (15)$$

where $N_S$=the total number of blocks that will be made from the burst,
$I_{TOT}$=the total number of rows of width $N_T$ that can be made from the burst, and
$I_{T,MAX}$=the maximum number of rows of width $N_T$ which can be made from a block of maximum size $B_T$ bits or symbols.

Next the minimum depth $I_{T,BASE}$ of the first block is calculated as follows:

$$I_{T,BASE} = I_{TOT}/N_S \quad (16)$$

where $I_{TOT}$ is total number of rows of width $N_T$ bits or symbols that can be made from the burst of length $N_P$ bits or symbols, and
$N_S$ is the integer number of blocks to be made.

The remainder from the division of equation (16) is kept and will be distributed among the blocks to be created to increase their depths by one until the remainder is exhausted. It is this step which eliminates the need for the repetitive divide step of prior art method 1 or the divide followed by a multiply of prior art method 2. The remainder of equation (16) is stored in the registers 10 by the control logic 12. This remainder represents the number of rows left over after an integer number of blocks of depth $I_{T,BASE}$ are formed.

Each block is then stored in the registers 10 using the data from line 20 to fill in the bit or symbol slots of each row. If the remainder is now zero, then the first block will be formed to have a number of rows equal to $I_{T,BASE}+1$.

After the first block has been formed, the remainder is decremented by one by the control logic 12 and a test is made to compare the new remainder to zero. If the new remainder is not zero, then the second block is formed so as to have a depth of $I_{T,BASE}+1$.

After the second block is stored in memory, the remainder is again decremented by one and the new value for the remainder is compared to zero. If the remainder still is not zero, then the third block is formed so as to have a depth of $I_{T,BASE}+1$.

This process of forming blocks and increasing their depth by one to $I_{T,BASE}+1$ is continued until the remainder has been decremented to zero. Once the remainder has reached zero, any subsequently formed blocks are formed with a depth $I_{T,BASE}$ and formation of blocks with depth $I_{T,BASE}$ is continued until $N_S$ blocks have been formed.

In alternative embodiments, the remainder can be distributed to a number of sequentially formed blocks which are the last N blocks formed in the sequence where N is equal to the remainder. In still other alternative embodiments, if the remainder is N, then any N blocks in the sequence can have one additional row added regardless of whether the blocks are sequentially formed and regardless of where in the sequence of blocks formed from the burst, the N blocks lie.

Figure 2:
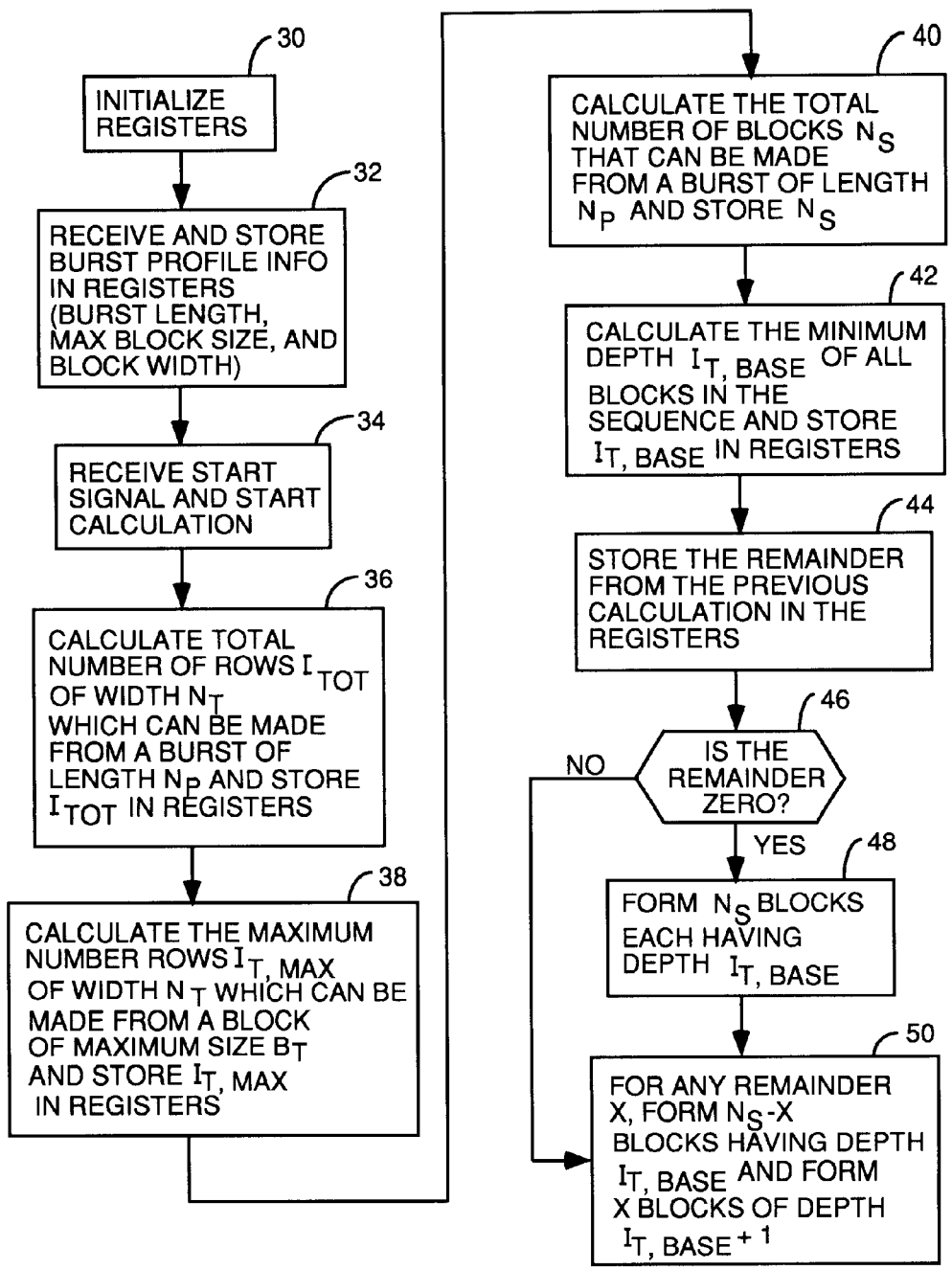
FIG. 2 is a flow diagram of a process within the genus of the invention. There are several processes that fall within the genus of the invention, but all of these different species share one common characteristic. That characteristic is that they save the remainder and use it to calculate the depth of a number of blocks N that is equal to the remainder using an iterative add instead as opposed to throwing the remainder away and calculating the block depths using an iterative divide or a one time divide followed by a one time multiply as is done in prior art methods 1 and 2.

FIG. 2 is a flow diagram of a process within the genus of the invention. There are several processes that fall within the genus of the invention, but all of these different species share one common characteristic. That characteristic is that they save the remainder and use it to calculate the depth of a number of blocks N that is equal to the remainder using an iterative add instead as opposed to throwing the remainder away and calculating the block depths using an iterative divide or a one time divide followed by a one time multiply as is done in prior art methods 1 and 2.

Step 30 represents the process of initializing the registers to erase the blocks of data from the previous burst and erase the burst profile data and calculated results from the last burst.

Next in step 32, the burst profile data such as the burst length $N_P$, the maximum block size $B_T$ and the block width $N_T$ are received and stored in the registers.

Step 34 represents the process of monitoring line 14 for the occurrence of the start signal $S_B$, and when the start signal becomes active, starting the calculation.

Step 36 represents the process of calculating the total number of rows $I_{TOT}$ of width $N_T$ which can be made from the burst of length $N_P$. This is done by recalling the values of $N_P$ and $N_T$ from the registers and loading them into the divider 22 and making the division of Equation (13). The control logic 12 then receives the quotient and the remainder from the divider 22 and carries out the CEIL mathematical operation by adding one to the quotient if there is a non zero remainder and writing the result into the registers 10 as the value of $I_{TOT}$. If the remainder is zero, then the control logic stores the quotient in the registers as the value $I_{TOT}$.

Step 38 represents the process of calculating the maximum number of rows $I_{T,MAX}$ of width $N_T$ which can be made from a block of maximum size $B_T$. This is done by the control logic retrieving the values of $B_T$ and $N_T$ from the registers 10 and loading them into the divider 22 as the operands for the division of Equation (14). The control logic then receives the quotient and the remainder and discards the remainder. The quotient is then written into the registers as the value $I_{T,MAX}$.

Next, in step 40 the process of calculating the total number of blocks $N_S$ that can be made from the burst of length $N_P$ is performed. This is implemented by the control logic 12 retrieving the values of $I_{TOT}$ and $I_{T,MAX}$ calculated in steps 36 and 38 from the registers and loading these values into divider 22 as the operands of Equation (15). The control logic then causes the divider to divide $I_{TOT}$ by $I_{T,MAX}$ and receives the quotient and the remainder. The control logic examines the remainder to determine if it is non zero. If the remainder is non zero, then the control logic adds one to the quotient and stores the result as the value $N_S$ in the registers to implement the CEIL logic function. If the remainder is zero, then the control logic implements the CEIL math function simply by writing the quotient into the registers as the value for $N_S$.

Step 42 represents the process of implementing Equation (16) to calculate maximum depth $I_{T,BASE}$ for each block in the sequence. To do this, the control logic retrieves the values of $I_{TOT}$ and $N_S$ from the registers and loads them into the divider 22 as the operands for the division of Equation (16). The control logic then causes the divider 22 to make the division of Equation (16) and receives both the remainder and the quotient. The quotient is stored in step 42 in the registers as the value of $I_{T,BASE}$.

Step 44 represents the process of storing the remainder from the division in step 42 in the registers so that can be used to determine the actual depth of each block to be formed.

The process of calculating the actual depth for each block is started in step 46. In this step, the control logic compares the value of the remainder to zero. If the remainder is zero, then step 48 is performed to form $N_S$ blocks each having depth $I_{T,BASE}$. This is done by the control logic writing bits or symbols from data line 20 into rows of memory locations or shift registers of width $N_T$. This process is repeated until $I_{T,BASE}$ rows of data have been stored. The process is then repeated to make the next block and the next block until $N_S$ blocks have been formed.

If step 46 determines that the remainder stored in step 44 is not zero, then the process represented by step 50 is performed. Step 50 represents all processes for using the remainder to create some blocks that are $I_{T,BASE}+1$ rows in depth and other blocks have depth $I_{T,BASE}$. For example, if the remainder is some value X (X will always be less then the number of blocks $N_S$ to be created) then $N_S-X$ blocks will be created having depth $I_{T,BASE}$. Likewise, X blocks will be created that have $I_{T,BASE}+1$ rows. It is up to the control logic to create these blocks using the remainder as a guide as to how many blocks have depth $I_{T,BASE}+1$ and how many of the $N_S$ blocks created from each burst have depth $I_{T,BASE}$. The control logic can scatter the blocks having depth $I_{T,BASE}+1$ in any way among the $N_S$ blocks created from each burst. On the next burst, the entire process is repeated.

The control logic also is responsible for addressing and reading the data bits or symbols in each block so that they are read out sequentially column by column for transmission. This implements the interleaving.

Although the invention has been disclosed in terms of several alternative embodiments herein, those skilled in the art will appreciate other embodiments that share the above noted common characteristic of the genus. All such species are intended to be included with the scope of the appended claims.

What is claimed is:

1. A process for interleaving data bits or data symbols comprising:

receiving and storing burst length data $N_P$, maximum block size data $B_T$ and block width data N from a burst profile;

calculating the total number of rows $I_{TOT}$ of width $N_T$ that can be created from a burst of data $N_P$ bits or symbols in length using the equation $$I_{TOT}=CEIL(N_P/N_T),$$

and storing the value of $I_{TOT}$;

calculating the maximum number of rows $I_{T,MAX}$ of width $N_T$ which can be made from a block of maximum size $B_T$ using the equation $$I_{T,MAX}=FLOOR(B_T/N_T)$$

and storing $I_{T,MAX}$;

calculating the total number of blocks $N_S$ of data that can be made from a burst of data bits or symbols of length $N_P$ bits or symbols using the equation $$N_S=CEIL(I_{TOT}/I_{T,MAX}),$$

and storing $N_S$;

calculating the minimum depth $I_{T,BASE}$ of all blocks in the sequence using the equation $$I_{T,BASE}=I_{TOT}/N_S$$

and storing $I_{T,BASE}$ and the remainder of the division;

comparing said remainder to zero;

if said remainders is zero, receiving a burst of $N_P$ data bits or symbols to be interleaved and storing it as $N_S$ blocks having rows of width $N_T$ and having $I_{T,BASE}$ rows; and if said remainder is any non zero integer X, receiving a burst of $N_P$ bits or symbols to be interleaved, forming $N_S-X$ blocks of said data bits or symbols having $I_{T,BASE}$ rows of width $N_T$ bits or symbols and forming X blocks of said data having $I_{T,BASE}+1$ rows of width $N_T$ bits or symbols.

2. An apparatus comprising:

a plurality of registers or memory locations for storing data;

a divider having inputs for receiving operands and having a quotient output and a remainder output;

control means coupled to said registers or memory locations and coupled to said divider and having an input to receive a burst of $N_P$, data bits or symbols to be interleaved and an input to receive a start of burst signal which indicates when a burst starts, said control means for using said registers and divider to calculate how many total rows of $N_T$ bits or symbols can be made from said burst of $N_P$ bits or symbols, and for calculating the maximum number of rows of width $N_T$ which can be made from a block of maximum size $B_T$ bits or symbols, and for calculating the total number $N_S$ of blocks of data that can be made from said burst of length $N_P$ bits or symbols, and for calculating the minimum depth $I_{T,BASE}$ for all of said $N_S$ blocks, and for using the remainder X from the calculation of $I_{T,BASE}$ for form X blocks of data bits or symbols having depth $I_{T,BASE}+1$ and width $N_T$ and $N_S-X$ blocks having depth $I_{T,BASE}$ and width $N_T$ without using either an iterative divide step or a divide step followed by a multiply step.

3. An apparatus comprising:

a plurality of memory locations in registers, shift registers, random access memory or any other type of read-write memory with sufficient access speed for an incoming data rate;

a divider;

means for using said memory locations and said divider to receive and store burst profile data and data to be interleaved and to interleave said data by writing data to be interleaved into the rows of a plurality of two-dimensional blocks, each said block comprised of a plurality of rows and columns of memory storage locations blocks, said means also for reading said data stored in said blocks out column by column so as to interleave said data in time, and for calculating a number of rows (hereafter referred to as the depth) of each said block using a predetermined algorithm which uses the remainder (hereafter referred to as X) of a calculation of a minimum depth $I_{T,BASE}$ to determine that X of $N_S$ total blocks will have a depth of $I_{T,BASE}+1$ and to determine that $N_S-X$ blocks will be formed with only a depth equal to $I_{T,BASE}$.

* * * * *